United States Patent
Liu, Jr. et al.

(10) Patent No.: US 9,515,283 B2
(45) Date of Patent: Dec. 6, 2016

(54) OLED DEVICES WITH INTERNAL OUTCOUPLING

(75) Inventors: Jie Jerry Liu, Jr., Niskayuna, NY (US); Srinivas Prasad Sista, Glenville, NY (US); Xiaolei Shi, Niskayuna, NY (US); Ri-An Zhao, Niskayuna, NY (US); Kelly Scott Chichak, Clifton Park, NY (US); Jeffrey Michael Youmans, Saratoga Springs, NY (US); Kevin Henry Janora, Schenectady, NY (US); Larry Gene Turner, Hagaman, NY (US)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 304 days.

(21) Appl. No.: 13/599,529

(22) Filed: Aug. 30, 2012

(65) Prior Publication Data
US 2014/0061593 A1 Mar. 6, 2014

Related U.S. Application Data

(60) Provisional application No. 61/694,427, filed on Aug. 29, 2012.

(51) Int. Cl.
*H01L 51/00* (2006.01)
*H01L 51/50* (2006.01)
*H01L 51/52* (2006.01)

(52) U.S. Cl.
CPC ....... *H01L 51/5072* (2013.01); *H01L 51/0067* (2013.01); *H01L 51/5088* (2013.01); *H01L 51/5268* (2013.01); *H01L 2251/5369* (2013.01)

(58) Field of Classification Search
CPC .......... H01L 51/5072; H01L 51/0067; H01L 51/5088; H01L 51/5268
USPC ...................... 313/495, 500, 503; 257/13, 40
See application file for complete search history.

(56) References Cited

U.S. PATENT DOCUMENTS

| | | |
|---|---|---|
| 3,739,217 A | 6/1973 | Bergh et al. |
| 5,540,999 A | 7/1996 | Yamamoto |
| 5,917,279 A | 6/1999 | Elschner et al. |
| 6,777,871 B2 | 8/2004 | Duggal et al. |
| 6,918,946 B2 * | 7/2005 | Korgel et al. ................... 75/362 |
| 6,965,197 B2 | 11/2005 | Tyan et al. |

(Continued)

FOREIGN PATENT DOCUMENTS

| | | |
|---|---|---|
| JP | 2007242927 A | 9/2007 |
| JP | 2009212238 A | 9/2009 |

(Continued)

OTHER PUBLICATIONS

Lee et al., "A High-Extraction-Efficiency Nanopatterned Organic Light-Emitting Diode", Applied Physics Letters, vol. 82, Issue 21, pp. 3779-3781, May 26, 2003.

(Continued)

*Primary Examiner* — Tucker J Wright
*Assistant Examiner* — Stephen C Smith
(74) *Attorney, Agent, or Firm* — Ladas & Parry LLP

(57) ABSTRACT

Optoelectronic devices with enhanced internal outcoupling include a substrate, an anode, a cathode, an electroluminescent layer, and an electron transporting layer comprising inorganic nanoparticles dispersed in an organic matrix.

17 Claims, 1 Drawing Sheet

(56) References Cited

U.S. PATENT DOCUMENTS

| | | | |
|---|---|---|---|
| 6,999,222 B2* | 2/2006 | Bazan et al. | 359/248 |
| 7,245,074 B2 | 7/2007 | Shiang | |
| 7,594,839 B2 | 9/2009 | Cok et al. | |
| 7,597,967 B2 | 10/2009 | Kondakova et al. | |
| 7,750,352 B2* | 7/2010 | Thurk | 257/79 |
| 7,800,297 B2* | 9/2010 | Reddy | B82Y 20/00 313/503 |
| 7,811,679 B2* | 10/2010 | Aziz et al. | 428/690 |
| 7,851,995 B2 | 12/2010 | Tyan et al. | |
| 7,872,414 B2 | 1/2011 | Sugita et al. | |
| 7,932,534 B2 | 4/2011 | Singh et al. | |
| 7,957,621 B2* | 6/2011 | Zhang et al. | 385/131 |
| 7,981,527 B2 | 7/2011 | Cheng et al. | |
| 7,993,747 B2* | 8/2011 | Mochizuki et al. | 428/403 |
| 8,088,499 B1 | 1/2012 | Wang et al. | |
| 8,232,722 B2* | 7/2012 | Bawendi et al. | 313/506 |
| 8,354,785 B2* | 1/2013 | Clough et al. | 313/498 |
| 8,384,071 B2* | 2/2013 | Yang et al. | 257/40 |
| 8,425,803 B2* | 4/2013 | Parce et al. | 252/301.6 S |
| 8,440,480 B2* | 5/2013 | Jang et al. | 438/29 |
| 8,563,968 B2* | 10/2013 | Akai | C09K 11/025 257/40 |
| 8,969,856 B2* | 3/2015 | Liu | H01L 51/0067 257/40 |
| 2003/0160260 A1* | 8/2003 | Hirai et al. | 257/103 |
| 2005/0253130 A1* | 11/2005 | Tsutsumi et al. | 257/13 |
| 2005/0266697 A1 | 12/2005 | Korgel et al. | |
| 2006/0083694 A1* | 4/2006 | Kodas et al. | 424/46 |
| 2007/0001581 A1* | 1/2007 | Stasiak et al. | 313/498 |
| 2007/0015003 A1 | 1/2007 | Hwang et al. | |
| 2007/0141394 A1 | 6/2007 | Cheng et al. | |
| 2007/0176547 A1* | 8/2007 | Park et al. | 313/506 |
| 2007/0207565 A1* | 9/2007 | Kodas et al. | 438/61 |
| 2008/0284320 A1 | 11/2008 | Karkkainen | |
| 2009/0026924 A1 | 1/2009 | Leung et al. | |
| 2009/0289224 A1 | 11/2009 | Liang et al. | |
| 2009/0309068 A1 | 12/2009 | Schafer et al. | |
| 2010/0001301 A1 | 1/2010 | Karg et al. | |
| 2010/0194267 A1 | 8/2010 | Forrest et al. | |
| 2010/0224856 A1* | 9/2010 | Iizumi et al. | 257/13 |
| 2010/0244062 A1* | 9/2010 | Ueno | 257/90 |
| 2010/0283045 A1* | 11/2010 | Uchida | B82Y 20/00 257/40 |
| 2010/0297430 A1* | 11/2010 | Thies et al. | 428/323 |
| 2010/0320446 A1 | 12/2010 | Kang et al. | |
| 2011/0045392 A1* | 2/2011 | Lemmer | H01L 51/5048 430/56 |
| 2011/0062476 A1 | 3/2011 | Tobise | |
| 2011/0168976 A1 | 7/2011 | Mao | |
| 2011/0194270 A1 | 8/2011 | Di Trapani et al. | |
| 2011/0229992 A1 | 9/2011 | Potts et al. | |
| 2011/0260148 A1 | 10/2011 | Lee et al. | |
| 2011/0262093 A1 | 10/2011 | Lamansky et al. | |
| 2011/0284819 A1* | 11/2011 | Kang | B82Y 20/00 257/9 |
| 2011/0284825 A1* | 11/2011 | Yang | H01L 51/5048 257/40 |
| 2012/0068154 A1* | 3/2012 | Hwang | H01L 51/502 257/13 |
| 2012/0118368 A1* | 5/2012 | Huang | B82Y 10/00 136/256 |
| 2012/0292594 A1* | 11/2012 | Zhou et al. | 257/13 |
| 2012/0305895 A1* | 12/2012 | Chae et al. | 257/40 |
| 2013/0140534 A1* | 6/2013 | Lai et al. | 257/40 |
| 2013/0200360 A1 | 8/2013 | Oikawa | |

FOREIGN PATENT DOCUMENTS

| | | |
|---|---|---|
| JP | 2013122994 A | 6/2013 |
| WO | WO2011162080 A1 | 12/2011 |
| WO | WO2012029750 A1 | 3/2012 |
| WO | 2012053398 A1 | 4/2012 |

OTHER PUBLICATIONS

Riedel et al., "Methods for Increasing the Efficiency of Organic Light Emitting Diodes", Solid-State and Organic Lighting (SOLED), Location: Karlsruhe, Germany, 2 pages, Jun. 21, 2010.

Fina et al., "Improving Organic Light-Emitting Diode Performance with Patterned Structures", Applied Physics A: Materials Science & Processing, vol. 105, Issue 2, pp. 323-327, 2011.

Chang et al., "Fourfold Power Efficiency Improvement in Organic Light-Emitting Devices Using an Embedded Nanocomposite Scattering Layer", Organic Electronics, vol. 13, Issue 6, pp. 1073-1080, Jun. 2012.

Hofman, "Organic Light-Emitting Diodes for Lighting Applications Based on Molecular Doping Technology", Organic Electronics Day @ MateriaNova, Mons/Belgium, Novaled AG, pp. 1-36, Oct. 20, 2011.

Lupton et al., "Bragg Scattering From Periodically Microstructured Light Emitting Diodes", Applied Physics Letters, vol. 77, No. 21, pp. 3340-3342, Nov. 20, 2000.

PCT Search Report and Written Opinion dated Jan. 21, 2014, issued in connection with corresponding WO Application No. PCT/US2013/056167.

* cited by examiner

OLED DEVICES WITH INTERNAL OUTCOUPLING

CROSS-REFERENCE TO RELATED APPLICATIONS

This application is a non-provisional of and claims priority from U.S. provisional application Ser. No. 61/694,427, filed 29 Aug. 2012, the entire disclosure of which is incorporated herein by reference.

STATEMENT REGARDING FEDERALLY SPONSORED RESEARCH AND DEVELOPMENT

This invention was made with Government support under contract number DOE DE-EE0003250 awarded by the U.S. Department of Energy. The Government has certain rights in the invention.

BACKGROUND

Organic light-emitting devices (OLEDs) have shown great potential for general illumination. A typical OLED consists of one or more organic layers sandwiched between two electrodes, which are stacked on a supporting substrate such as glass and plastic sheet. The OLED operates as an electroluminescent device. Light generated in the organic layers propagates in all the directions.

State-of-the-art OLED emissive materials generally have a refractive index greater than 1.7 that is substantially higher than that of most of the supporting substrates (usually ~1.5). As light propagates from a higher index medium to a lower index medium, total internal reflection (TIR) occurs for light beams travelling in large oblique angles relative to the interface, according to Snell's law. TIR leads to power trapping in the higher index medium and reduces light extraction efficiency. In a typical OLED device, TIR occurs between organic layers (refractive index ~1.7) and the substrate (refractive index ~1.5); and between the substrate (refractive index ~1.5) and air (refractive index 1.0), which leads to light trapping in the "organic modes" as well as the "substrate modes". In addition, some of the emitted light is coupled to "surface plasmon mode", which is a surface wave traveling along the metal cathode-ETL interface. This results in light trapping in the device and further reduces light extraction efficiency. Thus, an OLED, in its simplest form, usually exhibits poor light extraction efficiency. It is commonly believed that only ~20% of light generated can escape from an OLED device without any light extraction mechanism.

Different technical methods and approaches have been used to improve light extraction. Examples include substrate surface roughening, surface texturing, such as 2D photonic structures, the use of microlenses, and the use of scattering films. These approaches have led to enhancements in light extraction through substrate modification and optimization. However, work in the field to date has mainly focused on substrate modification.

In dry-coated OLEDs, all the organic layers have similar refractive index. For wet-coated OLEDs, however, state-of-the-art OLEDs typically employ a p-doped polymeric hole-injection layer (HIL); a well-known example of a polymeric HIL is PEDOT:PSS. Most of the p-doped polymeric HILs have a refractive index of <1.5, which is much less than that of state-of-the-art OLED emissive materials (typically >1.7). As a result, additional TIR occurs at the EML-HIL interface and further reduces light extraction efficiency. For planarization of the anode, typical thickness of HIL is greater than 100 nm. However, as the thickness of HIL increases, light penetration through HIL decays further. For example, in a low index HIL, EQE decreases with increasing HIL thickness because of the TIR at the emissive layer and HIL interface, resulting in an additional 14% loss in emitted power. Therefore, the mismatch in refractive index is one of the limiting factors for light extraction efficiency in wet-coated OLEDs, and there is a need to improve light extraction from wet-coated OLED devices.

BRIEF DESCRIPTION

Light extraction from wet-coated OLED devices may be improved by optimizing the charge injection or transport layers to direct more light into a supporting substrate, thus maximizing the final light extraction efficiency. Accordingly, in one aspect, the present invention relates to an optoelectronic device that has at least one charge carrier injecting or transporting layer that includes inorganic nanoparticles having a bimodal particle size distribution and dispersed in an organic matrix. In another aspect, the present invention relates to an optoelectronic device that includes an electron transporting layer comprising inorganic nanoparticles dispersed in an organic matrix. In yet another aspect, the present invention relates to an optoelectronic device wherein the surface of the electron transporting layer that is contiguous to the cathode is uneven.

In yet another aspect, the present invention relates to an optoelectronic device comprising
  a substrate;
  an anode;
  a cathode;
  an electroluminescent layer; and
  electron transporting layer comprising a fluoro compound of formula I

wherein
$Ar^1$ is $C_5$-$C_{40}$ aryl, $C_5$-$C_{40}$ substituted aryl, $C_5$-$C_{40}$ heteroaryl, or $C_5$-$C_{40}$ substituted heteroaryl;
$Ar^2$ is, independently at each occurrence, fluoro- or fluoroalkyl-substituted $C_{5-40}$ heteroaryl; and
n is 1, 2, or 3.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
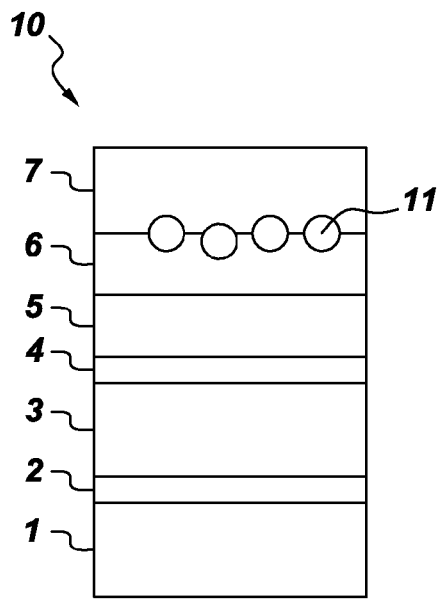
FIG. 1 is a cross sectional view of an optoelectronic device having a hole injecting layer that contains a population of inorganic nanoparticles having a bimodal particle size distribution.

FIG. 1 illustrates a first embodiment of an optoelectronic device according to the present invention. Device 10 includes substrate 1, anode 2, hole injecting layer 3, hole transporting layer 4, electroluminescent layer 5; electron transporting layer 6, and cathode 7. Electron transporting layer 6 contains a population of inorganic nanoparticles 11. Mean particle size of the inorganic nanoparticles 11 ranges from about 10 nm to about 100 nm, particularly from about 30 nm to about 100 nm. Average distance between adjacent particles may range from about 250 nm to about 600 nm, and distribution of the particles may be pseudo-periodic.

Refractive index of the inorganic nanoparticles 11 is at least 0.1 less than that of the organic material or organic matrix of electron transporting layer 6, particularly at least 0.2 less than that of the organic matrix. Suitable materials for the organic matrix of electron transporting layer 6 include compounds containing a pyridinyl group, that is, compounds containing a pyridine ring, particularly those containing a phenyl pyridinyl group. Examples of suitable materials for electron transporting layer 6 are described in but are not limited to, poly(9,9-mono- or disubstituted fluorene), tris(8-hydroxyquinolato) aluminum (Alq3), 2,9 dimethyl-4,7-diphenyl-1,1-phenanthroline, 4,7-diphenyl-1,10-phenanthroline, 2-(4-biphenylyl)-5-(4-t-butylphenyl)-1,3,4-oxadiazole, 3-(4-biphenylyl)-4-phenyl-5 (4 t butylphenyl)-1,2,4-triazole, 1,3,4-oxadiazole-containing polymers, 1,3,4-triazole-containing polymers, quinoxaline-containing polymers, cyano-PPV, and particularly, compounds containing phenyl pyridine units, as described in U.S. Pat. No. 8,062,768 and U.S. Pat. No. 8,039,125. Refractive index of suitable materials is typically about 1.7. Where these materials are used as the organic matrix of electron transporting layer 6, refractive index of inorganic nanoparticles 11 less than 1.7, particularly less than about 1.5, more particularly less than about 1.4.

Inorganic nanoparticles 11 are composed of a metal oxide or alkali metal fluoride or alkali earth metal fluoride dielectric material, particularly a metal oxide. Suitable metal oxides include indium tin oxide, titanium oxide, zinc oxide zirconium oxide, hafnium oxide, rhodium oxide, tungsten oxide, molybdenum oxide, vanadium oxide, silicon oxide, and combinations thereof. Suitable alkali metal fluorides include LiF, NaF, KF, RbF and combinations thereof; suitable alkali earth metal fluorides include $BeF_2$, $MgF_2$, $CaF_2$, $SrF_2$, $BaF_2$ and combinations thereof. In particular, LiF, NaF, $CaF_2$ and combinations thereof may be used. Inorganic nanoparticles 11 may be spherical or elliptical, but physical form or shape is not limited, and other forms, for example, flat platelets, may be used. The nanoparticle may be solid or have a core-shell structure. Concentration of the inorganic nanoparticles in electron transporting layer 6 ranges from about 5% by weight to about 50% by weight, particularly from about 10% by weight to about 30% by weight, more particularly from about 15% by weight to about 25% by weight.

FIG. 1 shows the inorganic nanoparticles located at the surface of electron transporting layer 6 adjacent to cathode 7, that is, at the ETL/cathode interface, or, where an electron injecting layer is included in the device between the electron transporting layer and the electron injecting layer, at the ETL/EIL cathode interface. In other embodiments, the inorganic nanoparticles may be located in one or more of the other layers of the device, in addition to electron transporting layer 6, including hole injecting layer 3, hole transporting layer 4, and electroluminescent layer 5.

Substrate 1 is typically composed of glass or a transparent plastic, and may include a barrier layer. Materials suitable for use in anode 2 include, but are not limited to, materials having a bulk resistivity of less than about 1000 ohms per square, as measured by a four-point probe technique. A solid layer of a transparent conductive oxide (TCO) may be used, or a discontinuous matrix of metallic rods, such as a mesh or grid composed of metallic nanowires, or a film composed of metal, particularly silver, nanowires, may be used. Indium tin oxide (ITO) is frequently used as the anode because it is substantially transparent to light transmission and thus facilitates the escape of light emitted from electro-active organic layer. Other oxides that may be utilized as the anode layer include tin oxide, indium oxide, zinc oxide, indium zinc oxide, zinc indium tin oxide, antimony oxide, and mixtures thereof. The nanowires may be used with the TCO layer, or may be used alone, allowing direct contact between substrate 1 and hole injecting layer 3.

Materials suitable for use in hole injecting layer 3 include 3,4-ethylenedioxythiophene (PEDOT) and blends of PEDOT with polystyrene sulfonate (PSS), commercially available from H.C. Stark, Inc. under the BAYTRON® trade name. Materials suitable for use in hole transporting layer 4 include, but are not limited to, PEDOT, PEDOT:PSS, 1,1-bis((di-4-tolylamino) phenyl)cyclohexane, N,N'-bis(4-methylphenyl)-N,N'-bis(4-ethylphenyl)-(1,1'-(3,3'-dimethyl)biphenyl)-4,4'-diamine, tetrakis-(3-methyl-phenyl)-N,N,N',N'-2,5-phenylenediamine, phenyl-4-N,N-diphenylaminostyrene, p-(diethylamino) benzaldehyde diphenylhydrazone, triphenylamine, 1-phenyl-3-(p-(di-ethylamino)styryl)-5-(p-(diethylamino)phenyl) pyrazoline, 1,2-trans-bis(9H-carbazol-9 yl)cyclobutane, N,N,N',N'-tetrakis-(4-methylphenyl)-(1,1'-biphenyl)-4,4'-diamine, copper phthalocyanine, polyvinylcarbazole, (phenylmethyl)polysilane, polyaniline, polyvinylcarbazole, triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

Materials suitable for use in electroluminescent layer 5 include, but are not limited to, electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly (vinylcarbazole) and polyphenylene-vinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)-pyridinato-N,C2) (blue dye). Commercially available electrofluorescent and electrophosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Materials suitable for use as cathode 7 include general electrical conductors including, but not limited to, metals and metal oxides such as ITO which can inject negative charge carriers (electrons) into the inner layer(s) of the OLED. Metals suitable for use as the cathode include K, Li, Na, Cs, Mg, Ca, Sr, Ba, Al, Ag, Au, In, Sn, Zn, Zr, Sc, Y, elements of the lanthanide series, alloys thereof, and mixtures thereof. Suitable alloy materials for use as the cathode layer include Ag—Mg, Al—Li, In—Mg, Al—Ca, and Al—Au alloys. Layered non-alloy structures may also be employed in the cathode, such as a thin layer of a metal such as calcium, or an alkali metal fluoride or alkali earth metal fluoride, such as LiF, covered by a thicker layer of a metal, such as aluminum or silver. In particular, the cathode may be composed of a single metal, and especially of aluminum or silver metal.

Figure 2:
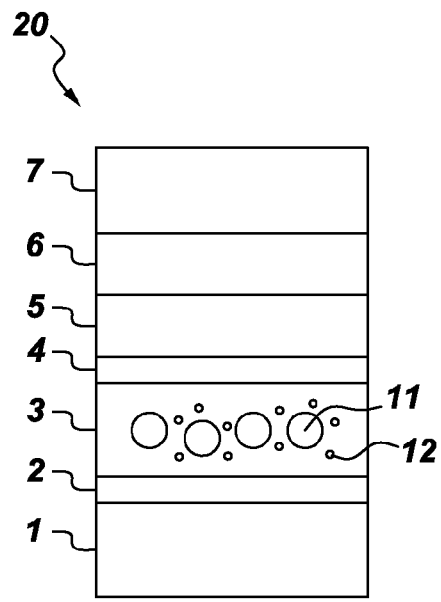
FIG. 2 is a cross sectional view of an optoelectronic device having an electron transporting layer that contains inorganic nanoparticles.

FIG. 2 illustrates a second embodiment of an optoelectronic device according to the present invention. Device 20 includes substrate 1, anode 2, hole injecting layer 3, hole transporting layer 4, electroluminescent layer 5; electron transporting layer 6, and cathode 7. Hole injecting layer 3 contains a population of inorganic nanoparticles having a bimodal particle size distribution, and includes inorganic nanoparticles 11 of a first subpopulation and inorganic nanoparticles 12 of a second subpopulation. Mean particle size of inorganic nanoparticles 11 ranges from about 10 to about 100 nm, and of inorganic nanoparticles 12 ranges from about 50 nm to about 10000 nm, particularly 5000 nm. Average distance between adjacent particles may range from about 250 nm to about 600 nm, and distribution of the particles may be pseudo-periodic.

Refractive index of the inorganic nanoparticles 11 and 12 is at least 0.1 greater than that of the organic material or organic matrix of the layer, particularly at least 0.2 greater than that of the organic matrix. Suitable materials for the organic matrix of hole injecting layer 3 include polymers derived from a thiophene monomer, such as PEDOT, which has typically has a refractive index of about 1.5. Where PEDOT is used as the organic matrix of hole injecting layer 3, refractive index of inorganic nanoparticles 11 and 12 is at least 1.6, particularly at least 1.7, more particularly at least 2.0. Inorganic nanoparticles 11 and 12 may have the same refractive index, or the refractive index of the two subpopulations may be different.

Inorganic nanoparticles 11 and 12 are composed of a metal oxide, alkali metal fluoride, or alkali earth metal fluoride dielectric material, particularly a metal oxide. Suitable alkali metal fluorides include LiF, NaF, KF, RbF and combinations thereof; suitable alkali earth metal fluorides include $BeF_2$, $MgF_2$, $CaF_2$, $SrF_2$, $BaF_2$ and combinations thereof. In particular, LiF, NaF, $CaF_2$ and combinations thereof may be used. Suitable metal oxides include silicon oxide, titanium oxide, zirconium oxide, zinc oxide, and combinations thereof. Subpopulation 11 and subpopulation 12 may be composed of the same material, or may have different compositions. Inorganic nanoparticles 11 and 12 may be spherical or elliptical, but physical form or shape is not limited, and other forms, for example, flat platelets, may be used. The nanoparticle may be solid or have a core-shell structure. Concentration of the inorganic nanoparticles in hole injecting layer 3 ranges from about 5% by weight to about 50% by weight, particularly from about 10% by weight to about 30% by weight, more particularly from about 15% by weight to about 25% by weight.

FIG. 2 shows the inorganic nanoparticles located in the interior of hole injecting layer 3. In other embodiments, the inorganic nanoparticles may be located at the surface of hole injecting layer 3 adjacent to hole transporting layer 4, that is, at the HIL/HTL interface. In yet other embodiments, the inorganic nanoparticles may be located in one or more of the other layers of the device, in addition to hole injecting layer 3, including hole transporting layer 4, electroluminescent layer 5; and electron transporting layer 6.

Figure 3:
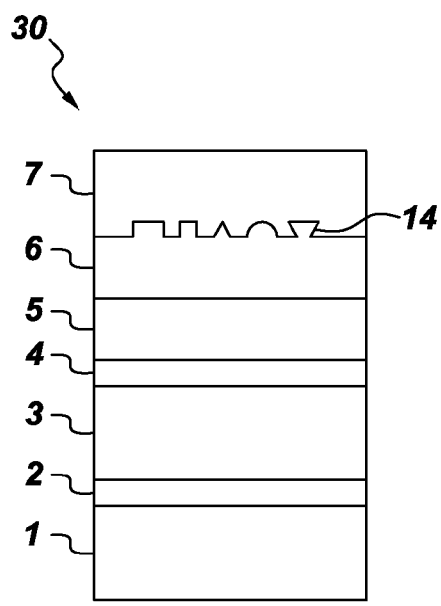
FIG. 3 is a cross sectional view of an optoelectronic device having a patterned electron transporting layer.
Figure 4:
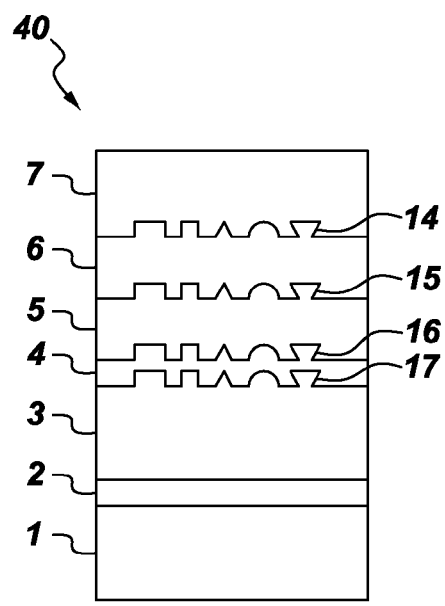
FIG. 4 is a cross sectional view of an optoelectronic device having patterned layers.

FIG. 3 illustrates a third embodiment of an optoelectronic device according to the present invention. Device 30 includes substrate 1, anode 2, hole injecting layer 3, hole transporting layer 4, electroluminescent layer 5; electron transporting layer 6, and cathode 7, wherein a surface of the electron transporting layer contiguous to the cathode, at the ETL/cathode interface, is uneven due to patterning of electron transporting layer 6. It should be noted that FIG. 1 also shows an embodiment wherein the surface of electron transporting layer 6 is uneven. In FIG. 1, inorganic nanoparticles are disposed at the interface, causing the surface and interface to be uneven or non-planar. The uneven surface may be formed by patterning electron transporting layer 6 using photolithography, nanolithography, nanoimprint lithography, including photo nanoimprint lithography, soft lithography, or surface roughening through phase-separation, polymer demixing, or colloidal lithography. Alternatively, the uneven surface may be formed by patterning of the underlying layers. FIG. 4 illustrates an embodiment wherein surfaces of hole injecting layer 3, hole transporting layer 4, electroluminescent layer 5; and electron transporting layer 6 are patterned. Methods of forming the patterned layers are not limited; all patterned layers may be formed by the same method, or different layers may be formed by different methods, or patterning of an underlying layer may result in the pattern being formed in the overlying layer.

Distribution of the elements of the pattern(s) may be pseudo-periodic. The pattern may be one-dimensional or two-dimensional, and period of the pattern may range from about 250 nm to about 600 nm. Pattern geometry is not limited, and many different shapes may be used.

In other embodiments, optoelectronic devices according to the present invention include an electron transporting layer comprising a fluoro compound of formula I; refractive index of such materials typically decreases with higher fluorine content

$$(Ar^2)_n\text{—}Ar^1\text{—}(Ar^2)_n \qquad I$$

wherein
$Ar^1$ is $C_5$-$C_{40}$ aryl, $C_5$-$C_{40}$ substituted aryl, $C_5$-$C_{40}$ heteroaryl, or $C_5$-$C_{40}$ substituted heteroaryl;
$Ar^2$ is, independently at each occurrence, fluoro- or fluoroalkyl-substituted $C_{5\text{-}40}$ heteroaryl; and
n is 1, 2, or 3.

In particular embodiments, $Ar^1$ is $C_5$-$C_{40}$ heteroaryl; more particularly, $Ar^1$ is

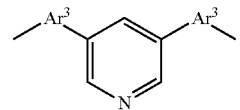

and $Ar^3$ is a direct bond, $C_5$-$C_{35}$ aryl, or $C_5$-$C_{35}$ heteroaryl. In other particular embodiments, $Ar^2$ is

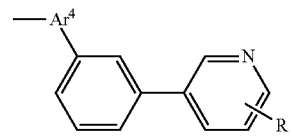

$Ar_4$ is a direct bond, $C_5$-$C_{35}$ aryl, or $C_5$-$C_{35}$ heteroaryl and R is fluoro or fluoroalkyl.

Suitable aryl or heteroaryl groups from which $Ar^1$ may be selected include phenyl, pyridinyl, carbazolinyl, furanyl, carbolinyl, fluorenyl, thiophenyl, and biphenyl. Suitable fluoro- or fluoroalkyl-substituted aryl or heteroaryl groups from which $Ar^2$ may be selected include pyridinyl, carbazolinyl, furanyl, carbolinyl, fluorenyl, thiophenyl, and biphenyl, each being fluoro- or fluoroalkyl-substituted, that is, containing at least one fluoro, or fluoroalkyl, substituent.

Fluoro compounds for use in optoelectronic device according to the present invention include In particular embodiments, $Ar^3$ is independently at each occurrence phenyl, pyridinyl, or biphenyl.

In yet another aspect, the present invention relates to an optoelectronic device that includes a substrate, an anode, a cathode, an electroluminescent layer; and an electron transporting layer comprising a fluorine-substituted compound.

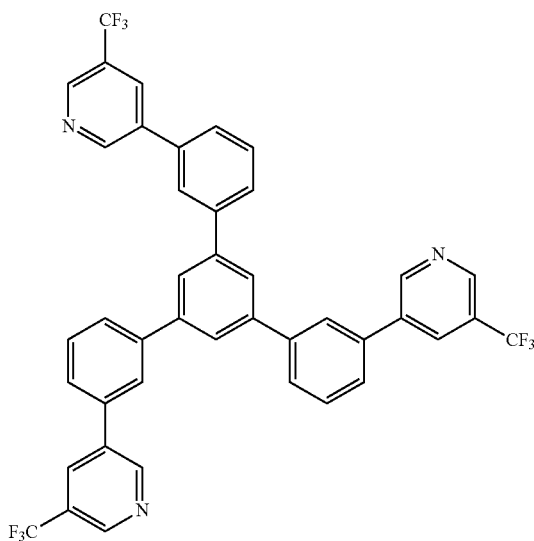

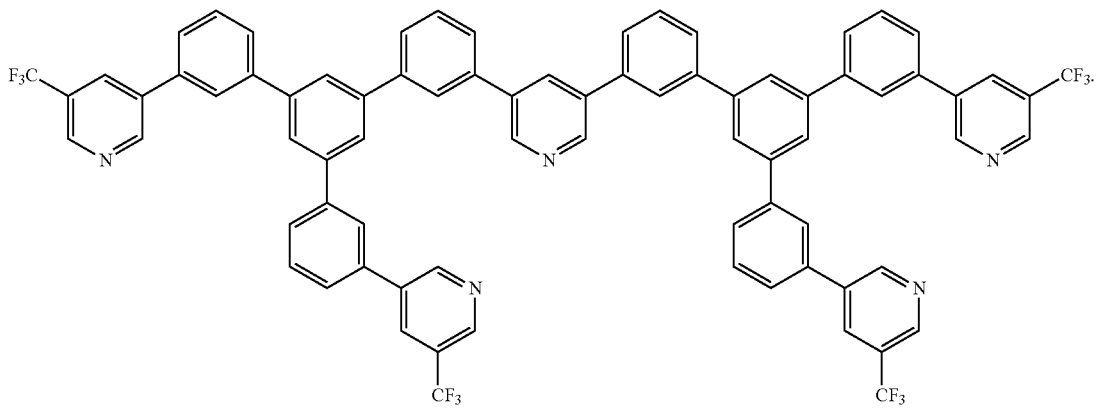

In yet another aspect, the present invention relates to fluoro compounds of formula II, and devices containing them,

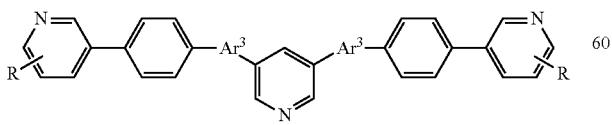

wherein $Ar^3$ is independently at each occurrence a direct bond, $C_5$-$C_{35}$ aryl, or $C_5$-$C_{35}$ heteroaryl.

EXAMPLES

Example 1

Preparation of 6-CF3 ETL Compound (5)

A 6-CF3 ETL compound (5) was prepared according to the general procedure shown in Scheme 1.

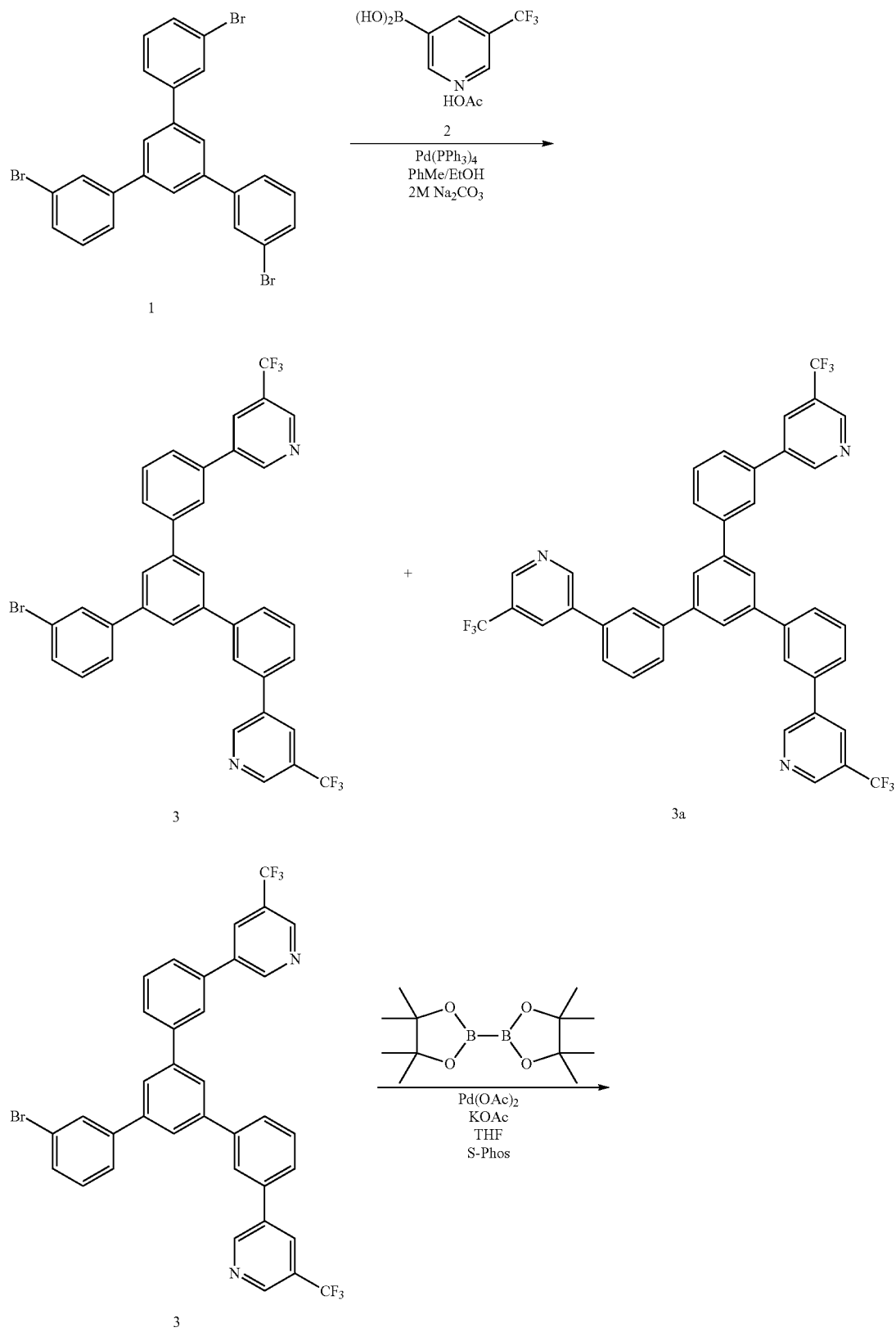

-continued
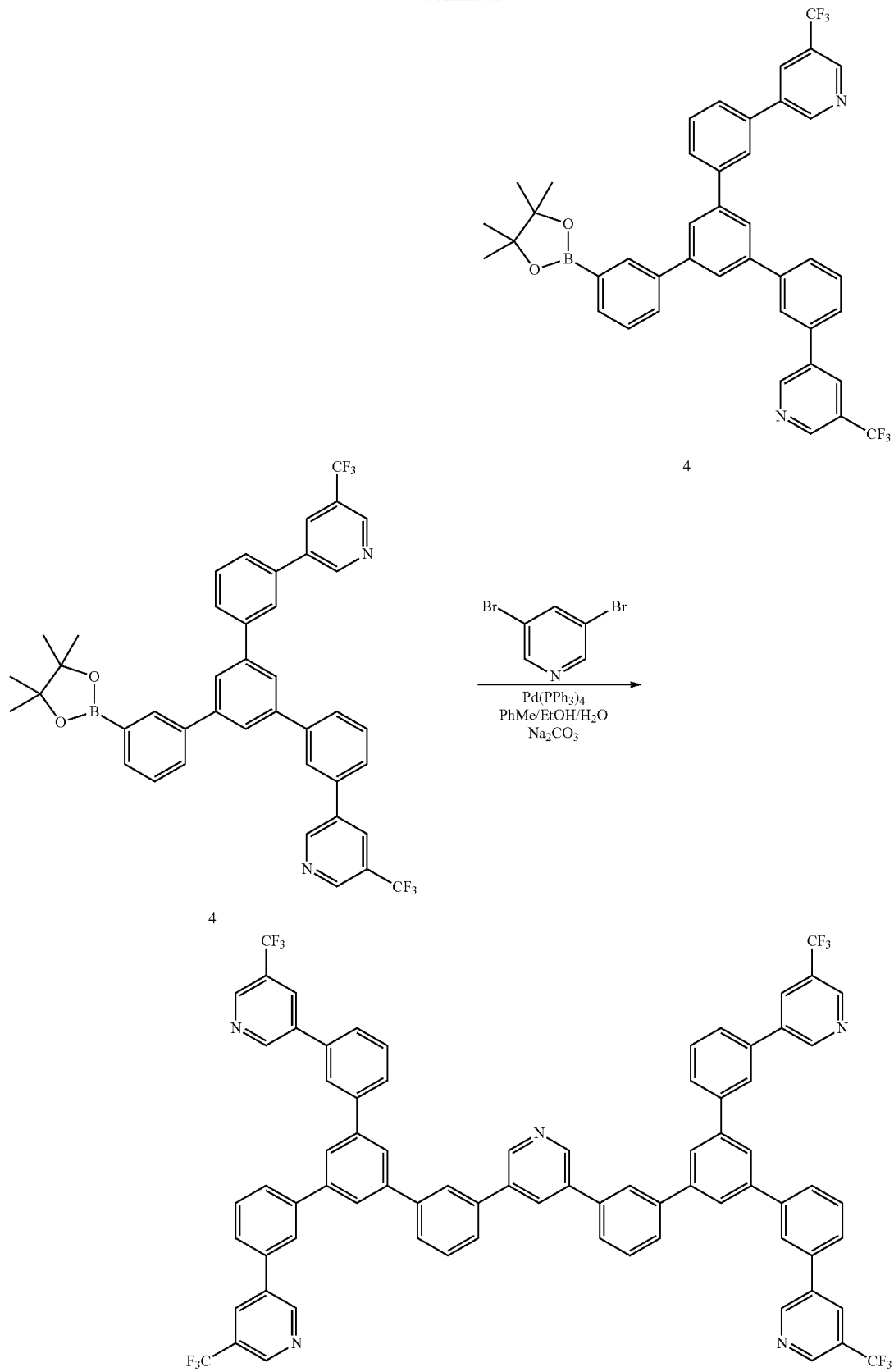

Boronic acid 2 shown in Scheme 1 was prepared according to a literature procedure (Org. Biomol. Chem. 2009, 7, 2155-2161). A flame dried flask was charge with triisopropyl borate (6.2 mL, 26.5 mmol), 3-bromo-5-trifluormethyl pyridine (5.0 g, 22.1 mmol), and THF (40 mL) under an inert atmosphere of nitrogen and was then subsequently cooled to −78° C. To this solution was added butyl lithium (10 mL, 24.6 mmol, 2.5 M in Hexanes) under controlled conditions. The reaction mixture was stirred at −78° C. for 3.5 h and was then allowed to warm to −10° C. At this temperature water was added (40 mL) and the contents of the flask were transferred to a single neck flask and the volatile solvents were removed. The water solution was treated with 3 pellets of NaOH and after they dissolved the water layer was washed with Et$_2$O. The pH of the water was adjusted to 5.0 by adding AcOH. The heterogenous mixture was transferred to a separatory funnel and the H$_2$O layer was extracted with EtOAc. The solvents were evaporated to dryness to give an off-white solid. $^1$H NMR compound 2.HOAc (400 MHz, DMSO+HCl$_{(aq)}$, 25° C.) δ 1.89 (s, 3H), 8.75 (s, 1H), 9.12 (d, 2H).

Compound 3: Boronic acid 2 (2.5 g, 10 mmol) and tribromide 1 (2.5 g, 4.5 mmol) were suspended in a mixture of Toluene (12 mL), EtOH (7 mL), and H$_2$O (12 mL). The mixture was purged with N$_2$ and treated with Na$_2$CO$_3$ (2.5 g, 24 mmol). After 10 min Pd(PPh$_3$)$_4$ (0.47 mg, 0.41 mmol) was added and the mixture was heated at 75° C. for 15 h. The reaction mixture was cooled, transferred to a separatory funnel, diluted with H$_2$O (100 mL) and extracted with EtOAc. The organic layer was washed with brine, dried and concentrated to give a foam. The crude product was chromatographed through SiO$_2$ (EtOAc:Hexanes, 1:9) to give compound 3 and 3a. Yield 3 1.25 g, 41%. Yield 3a 1.44, 43%. $^1$H NMR compound 3 (400 MHz, CD$_2$Cl$_2$, 25° C.) δ 7.40 (m, 1H), 7.55 (m, 1H), 7.68 (m, 5H), 7.88 (m, 8H), 8.21 (t, 2H), 8.60 (d, 2H), 8.93 (d, 2H); $^1$H NMR compound 3a (400 MHz, CD$_2$Cl$_2$, 25° C.) δ 7.69 (m, 6H), 7.87 (m, 3H), 7.97 (m, 6H), 8.21 (m, 3H), 8.89 (m, 3H), 9.13 (m, 3H).

Compound 4: To a flame dried 3-neck round bottom flask fitted with a condenser, a nitrogen inlet, and a rubber septum was added compound 3 (700 mg, 1.04 mmol), pinacolato diborane (395 mg, 1.55 mmol), dry KOAc (153 mg, 1.55 mmol), and the cyclohexyl phosphine ligand S-Phos (32.0 mg, 0.078 mmol). The flask was placed then protected from the atmosphere and was charged with anhydrous THF (10 mL) and the solution was degassed by purging N$_2$ through the stirred solution. After 15 min, the reaction mixture was charged with Pd(OAc)$_2$ (5.8 mg, 0.026 mmol) and the mixture was heated at reflux for 12 h. After this time had passed, the reaction mixture was cooled to RT, diluted with EtOAc (25 mL) and filtered through celite. The filter cake was washed with EtOAc and the filtrate was concentrated to dryness. The residue was chromatographed through SiO$_2$ with a mixture of EtOAc:Hexanes as eluent. $^1$H NMR (400 MHz, CD$_2$Cl$_2$, 25° C.) δ 1.35 (s, 12H), 7.51 (m, 1H), 7.68 (m, 4H), 7.90 (m, 9H), 8.14 (s, 1H), 8.22 (m, 2H), 8.89 (m, 2H), 9.13 (d, 2H).

Compound 5: A biphasic mixture of toluene (10 mL)/H$_2$O (5.0 mL)/EtOH (5.0 mL) containing Na$_2$CO$_3$ (1.10 g) was purged with nitrogen. To this solution was added the borate compound 4 (0.440 g, 0.608 mmol), 3,5-dibromopyridine (58.0 mg, 0.243 mmol) followed by Pd(PPh$_3$)$_4$ (25.0 mg, 0.0219 mmol). The reaction was placed under an inert atmosphere of nitrogen and heated at a gentle reflux for 16 h. The mixture was cooled to RT, transferred to a separatory funnel, extracted with EtOAc (3×30 mL), and dried over Na$_2$SO$_4$. The crude material was chromatographed through SiO$_2$ and eluted with 1% MeOH/CH$_2$Cl$_2$ to afford the product as a white foam. Yield 210 mg, 68%. $^1$H NMR (400 MHz, CD$_2$Cl$_2$, 25° C.) δ 7.50 (m), 7.66 (m), 7.84 (m), 7.97 (m), 8.04 (t), 8.20 (m), 8.25 (m) 8.87 (m), 8.94 (m), 9.12 (m).

Example 2

Preparation of 6-CF3 Reference Compound (6)

A 6-CF3 reference compound (6) was prepared according to the general procedure shown in Scheme 2.

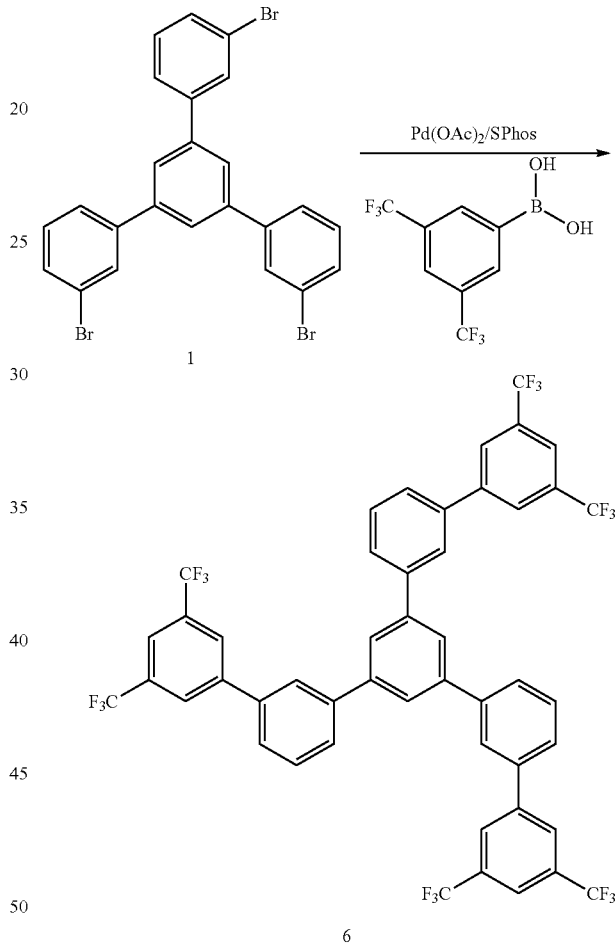

A biphasic mixture of toluene (50 mL)/H$_2$O (50.0 mL)/Dioxane containing Na$_2$CO$_3$ (2.9 g) was purged with nitrogen. To this solution was added the 3,5-bis(trifluoromethyl)phenylboronicacid (4.26 g, 16.5 mmol), and tribromide 1 (3.0 g, 5.5 mmol) followed by Pd(OAc)$_2$ (2.0 mol % w.r.t to each Br, 74 mgs, 0.33 mmol), dicyclohexylphosphine-2',6'-dimethoxy biphenyl (2.5 equs w.r.t Pd(OAc)$_2$ (0.338 g). The reaction was placed under an inert atmosphere of nitrogen and heated at a gentle reflux for 16 h. The mixture was cooled to RT, transferred to a separatory funnel, extracted with EtOAc (3×30 mL), and dried over Na$_2$SO$_4$. The crude material was chromatographed through SiO$_2$ and eluted first with Hexane to remove non-polar impurities and then with ethyl acetate:hexane=2:8 to obtain the product as a white foam. Yield 5.13 g. $^1$H NMR (400 MHz, $CD_2Cl_2$, 25° C.) δ 7.70 (m), 7.9 (m), 7.96 (m), 8.00 (m), 8.04 (m), 8.18 (m).

Example 3

Preparation of 3-CF3 Reference Compound (7)

A 6-CF3 ETL compound (5) was prepared according to the general procedure shown in Scheme 3.

Scheme 3

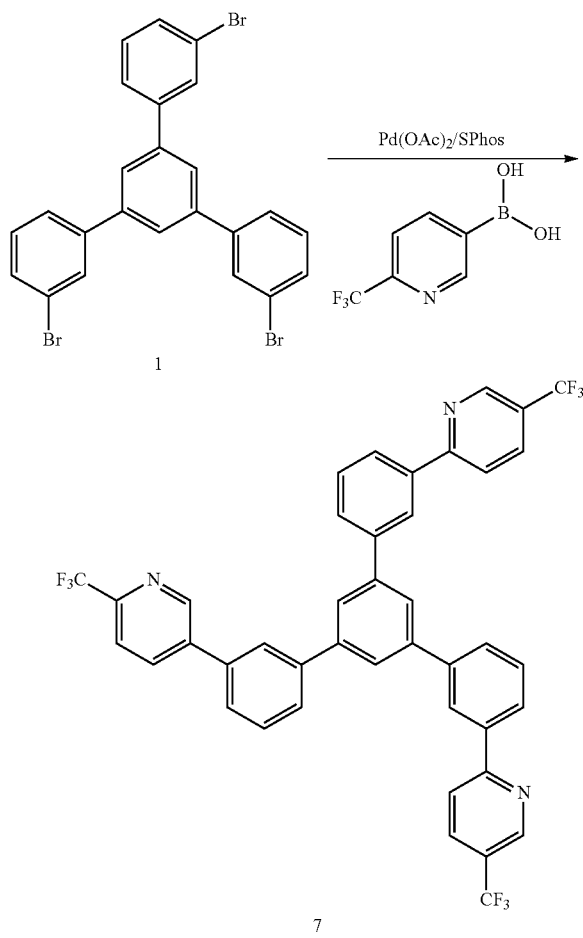

A biphasic mixture of toluene (10 mL)/$H_2O$ (10.0 mL)/Dioxane (50.0 mL) containing $Na_2CO_3$ (0.63 g) was purged with nitrogen. To this solution was added the 2-(trifluoromethyl)pyridine-5-boronicacid (0.7 g, 0.35 mmol), and tribromide 1 (0.65 g, 0.2 mmol) followed by $Pd(OAc)_2$ (2.0 mol % w.r.t to each Br, 6.7 mg), dicyclohexylphosphine-2',6'-dimethoxy biphenyl (2.5 equs w.r.t $Pd(OAc)_2$ (33 mg). The reaction was placed under an inert atmosphere of nitrogen and heated at a gentle reflux for 16 h. The mixture was cooled to RT, transferred to a separatory funnel, saturated sodium bicarbonate wash, extracted with EtOAc (3×30 mL), and dried over $MgSO_4$. The crude material was chromatographed through $SiO_2$ and eluted first with Hexane to remove non-polar impurities and then with ethyl acetate:hexane=2:8 to obtain the product as a white foam. Yield 0.45 g. $^1$H NMR (400 MHz, $CD_2Cl_2$, 25° C.) δ 7.75 (m), 7.82 (m), 7.9 (m), 8.10 (m), 8.20 (m), 9.08 (m).

Tribornylated triphenyl benzene (8): A biphasic mixture of THF (20 mL)/Dioxane (5.0 mL)/Dioxane containing $Na_2CO_3$ (2.9 g) was purged with nitrogen. To this solution was added the pinacolate diborane (4.89 g, 19.2 mmol), and tribromide 1 (3.0 g, 5.5 mmol), potassium acetate (1.62 g, 16.5 mmol) followed by $Pd(OAc)_2$ (2.0 mol % w.r.t to each Br, 74 mgs, 0.33 mmol), dicyclohexylphosphine-2',6'-dimethoxy biphenyl (2.5 equs w.r.t $Pd(OAc)_2$ (0.34 g). The reaction was placed under an inert atmosphere of nitrogen and heated at a gentle reflux for 12 h. The mixture was cooled to RT, transferred to a separatory funnel, extracted with EtOAc (3×30 mL), and dried over $Na_2SO_4$. The crude material was chromatographed through $SiO_2$ and eluted with ethyl acetate:hexane=2:8 to obtain the product as a white foam. Yield 5.13 g. $^1$H NMR (400 MHz, $CD_2Cl_2$, 25° C.) δ 1.4 (s), 7.5 (m), 7.8 (m), 7.85 (m), 8.2 (m).

Example 4

Preparation of 3-CF3 ETL Compound (9)

A 3-CF3 ETL compound (9) was prepared according to the general procedure shown in Scheme 4.

Scheme 4

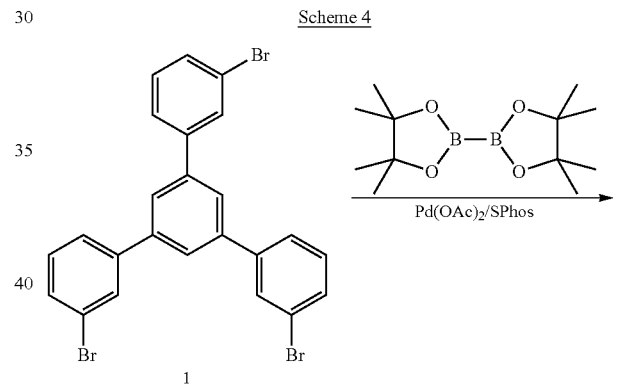

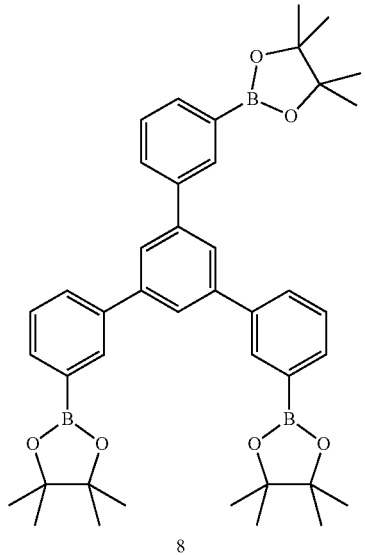

17
-continued

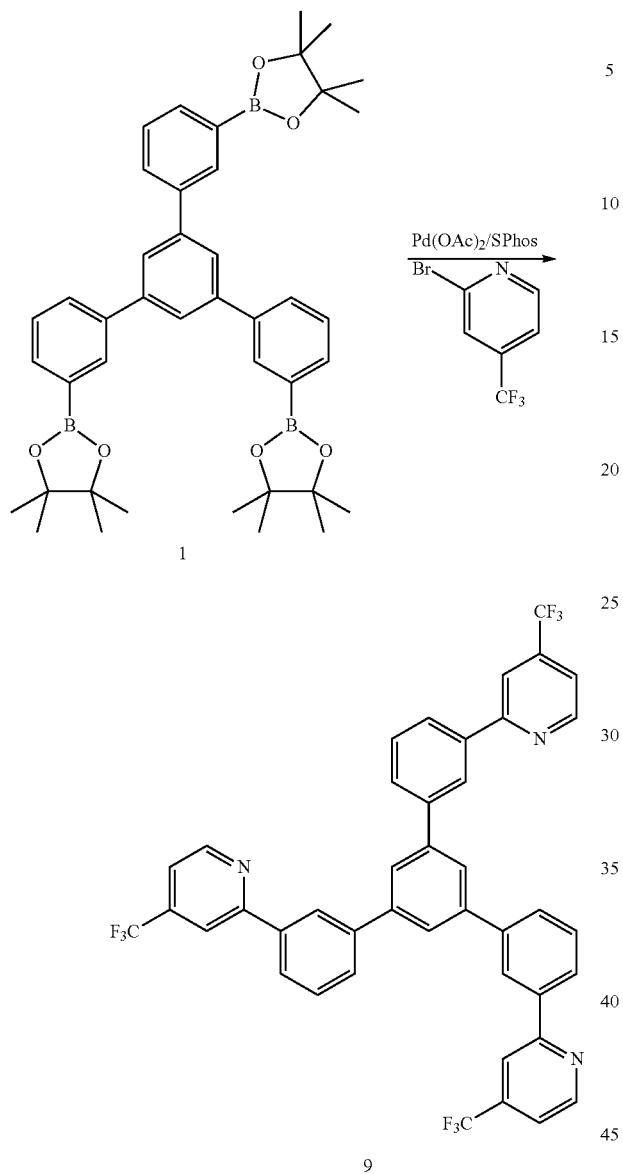

A biphasic mixture of toluene (10 mL)/H₂O (10.0 mL)/Dioxane (50.0 mL) containing Na₂CO₃ (0.388 g) was purged with nitrogen. To this solution was added the tribornylated triphenyl benzene (0.5 g, 0.2 mmol) and 2 bromo-4-trifluoromethyl pyridine (0.491 g, 3 equs), followed by Pd(OAc)₂ (2.0 mol % w.r.t to each Br, 10 mg), SPhos ligand (2.5 equs w.r.t Pd(OAc)₂ (45 mg). The reaction was placed under an inert atmosphere of nitrogen and heated at a gentle reflux for 12 h. The mixture was cooled to RT, transferred to a separatory funnel, saturated sodium bicarbonate wash, extracted with EtOAc (3×30 mL), and dried over MgSO₄. The crude material was chromatographed through SiO₂ and eluted first with ethyl acetate:hexane=1:9 to obtain the product (3$^{rd}$ product that got eluted from column chromatography) as a white foam. Yield 0.2 g. ¹H NMR (400 MHz, CD₂Cl₂, 25° C.) δ 7.55 (m), 7.7 (t), 7.94 (m), 8.10 (s), 8.15 (s), 8.2 (m), 8.5 (m), 8.98 (m).

18

Example 5

Preparation of 3-F Reference Compound (10)

A 3-F Reference compound (10 was prepared according to the general procedure shown in Scheme 5.

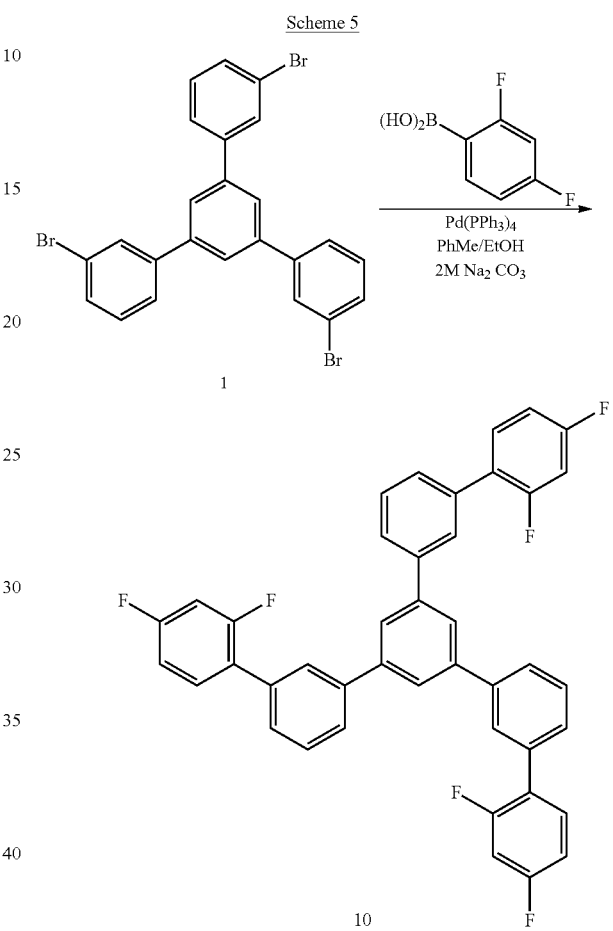

The boronic acid (6.5 g, 41.4 mmol) and tribromide 1 (5.0 g, 9.21 mmol) were suspended in a mixture of Toluene (25 mL), EtOH (15 mL), and H₂O (25 mL). The mixture was purged with N₂ and treated with Na₂CO₃ (5.5 g, 53 mmol). After 10 min Pd(PPh₃)₄ (956 mg, 0.828 mmol) was added and the mixture was heated at 75° C. for 15 h. The reaction mixture was cooled, transferred to a separatory funnel, diluted with H₂O (100 mL) and extracted with EtOAc. The organic layer was washed with brine, dried and concentrated to give a crude solid. The crude product was chromatographed through SiO₂ (EtOAc:Hexanes, 1:9) to give compound 3. Yield 1.25 g, 41%. ¹H NMR compound 1 (400 MHz, CD₂Cl₂, 25° C.) δ 7.40 (m, 1H), 7.55 (m, 1H), 7.68 (m, 5H), 7.88 (m, 8H), 8.21 (t, 2H), 8.60 (d, 2H), 8.93 (d, 2H).

Example 6

Refractive Index

Refractive index of compounds 5, 6, 7, and 9 were measured by ellipsometry. Refractive index decreased as the fluorine content increased.

In the context of the present invention, alkyl is intended to include linear, branched, or cyclic hydrocarbon structures and combinations thereof, including lower alkyl and higher alkyl. Preferred alkyl groups are those of $C_{20}$ or below. Lower alkyl refers to alkyl groups of from 1 to 6 carbon atoms, preferably from 1 to 4 carbon atoms, and includes methyl, ethyl, n-propyl, isopropyl, and n-, s- and t-butyl. Higher alkyl refers to alkyl groups having seven or more carbon atoms, preferably 7-20 carbon atoms, and includes n-, s- and t-heptyl, octyl, and dodecyl. Cycloalkyl is a subset of alkyl and includes cyclic hydrocarbon groups of from 3 to 8 carbon atoms. Examples of cycloalkyl groups include cyclopropyl, cyclobutyl, cyclopentyl, and norbornyl. Alkenyl and alkynyl refer to alkyl groups wherein two or more hydrogen atoms are replaced by a double or triple bond, respectively.

Aryl and heteroaryl mean a 5- or 6-membered aromatic or heteroaromatic ring containing 0-3 heteroatoms selected from nitrogen, oxygen or sulfur; a bicyclic 9- or 10-membered aromatic or heteroaromatic ring system containing 0-3 heteroatoms selected from nitrogen, oxygen or sulfur; or a tricyclic 13- or 14-membered aromatic or heteroaromatic ring system containing 0-3 heteroatoms selected from nitrogen, oxygen or sulfur. The aromatic 6- to 14-membered carbocyclic rings include, for example, benzene, naphthalene, indane, tetralin, and fluorene; and the 5- to 10-membered aromatic heterocyclic rings include, e.g., imidazole, pyridine, indole, thiophene, benzopyranone, thiazole, furan, benzimidazole, quinoline, isoquinoline, quinoxaline, pyrimidine, pyrazine, tetrazole and pyrazole.

Arylalkyl means an alkyl residue attached to an aryl ring. Examples are benzyl and phenethyl. Heteroarylalkyl means an alkyl residue attached to a heteroaryl ring. Examples include pyridinylmethyl and pyrimidinylethyl. Alkylaryl means an aryl residue having one or more alkyl groups attached thereto. Examples are tolyl and mesityl.

Alkoxy or alkoxyl refers to groups of from 1 to 8 carbon atoms of a straight, branched, cyclic configuration and combinations thereof attached to the parent structure through an oxygen. Examples include methoxy, ethoxy, propoxy, isopropoxy, cyclopropyloxy, and cyclohexyloxy. Lower alkoxy refers to groups containing one to four carbons.

Acyl refers to groups of from 1 to 8 carbon atoms of a straight, branched, cyclic configuration, saturated, unsaturated and aromatic and combinations thereof, attached to the parent structure through a carbonyl functionality. One or more carbons in the acyl residue may be replaced by nitrogen, oxygen or sulfur as long as the point of attachment to the parent remains at the carbonyl. Examples include acetyl, benzoyl, propionyl, isobutyryl, t-butoxycarbonyl, and benzyloxycarbonyl. Lower-acyl refers to groups containing one to four carbons.

Heterocycle means a cycloalkyl or aryl residue in which one or two of the carbon atoms is replaced by a heteroatom such as oxygen, nitrogen or sulfur. Examples of heterocycles that fall within the scope of the invention include pyrrolidine, pyrazole, pyrrole, indole, quinoline, isoquinoline, tetrahydroisoquinoline, benzofuran, benzodioxan, benzodioxole (commonly referred to as methylenedioxyphenyl, when occurring as a substituent), tetrazole, morpholine, thiazole, pyridine, pyridazine, pyrimidine, thiophene, furan, oxazole, oxazoline, isoxazole, dioxane, and tetrahydrofuran.

Substituted refers to residues, including, but not limited to, alkyl, alkylaryl, aryl, arylalkyl, and heteroaryl, wherein up to three H atoms of the residue are replaced with lower alkyl, substituted alkyl, alkenyl, substituted alkenyl, aryl, substituted aryl, haloalkyl, alkoxy, carbonyl, carboxy, carboxalkoxy, carboxamido, acyloxy, amidino, nitro, halo, hydroxy, $OCH(COOH)_2$, cyano, primary amino, secondary amino, acylamino, alkylthio, sulfoxide, sulfone, phenyl, benzyl, phenoxy, benzyloxy, heteroaryl, or heteroaryloxy.

Haloalkyl refers to an alkyl residue, wherein one or more H atoms are replaced by halogen atoms; the term haloalkyl includes perhaloalkyl. Fluoroalkyl refers to an alkyl residue, wherein one or more H atoms are replaced by fluorine atoms; the term fluoroalkyl includes perfluoroalkyl. Examples of fluoroalkyl groups that fall within the scope of the invention include $CH_2F$, $CHF_2$, and $CF_3$.

Approximating language, as used herein throughout the specification, may be applied to modify any quantitative representation that is not to be limited to the specific quantity specified and could permissibly vary without resulting in a change in the basic function to which it is related. Accordingly, a value modified by a term or terms, such as "about", is not to be limited to the precise value specified. In some instances, the approximating language may correspond to the precision of an instrument for measuring the value.

Any numerical value ranges recited herein include all values from the lower value to the upper value in increments of one unit provided that there is a separation of at least 2 units between any lower value and corresponding higher value. As an example, if it is stated that the amount of a component or a value of a process variable such as, for example, temperature, pressure, rate, time and the like is, for example, from 1 to 90, preferred from 20 to 80, more preferred from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An optoelectronic device comprising
   a substrate
   an anode,
   a cathode,
   an electroluminescent layer; and
   an electron transporting layer comprising inorganic nanoparticles dispersed in an organic matrix
   wherein the inorganic nanoparticles comprise an alkali metal fluoride, an alkali earth metal fluoride, or a combination thereof.

2. An optoelectronic device according to claim 1, wherein the inorganic nanoparticles have a bimodal particle size distribution.

3. An optoelectronic device according to claim 2, wherein the inorganic nanoparticles having a bimodal particle size distribution comprise a first subpopulation of inorganic nanoparticles having a mean particle size ranging from about 10 to about 50 nm.

4. An optoelectronic device according to claim 2, wherein the inorganic nanoparticles having a bimodal particle size distribution comprises a second subpopulation of inorganic nanoparticles having a mean particle size ranging from about 50 to about 300 nm.

5. An optoelectronic device according to claim 2, additionally comprising at least one charge carrier injecting or transporting layer comprising inorganic nanoparticles having a bimodal particle size distribution and dispersed in an organic matrix.

6. An optoelectronic device according to claim 1, wherein the inorganic nanoparticles are disposed at or near a surface of the electron transporting layer adjacent to the cathode.

7. An optoelectronic device according to claim 1, wherein concentration of the inorganic nanoparticles in the electron transporting layer ranges from about 5% by weight to about 50% by weight.

8. An optoelectronic device according to claim 1, wherein concentration of the inorganic nanoparticles in the electron transporting layer ranges from about 15% by weight to about 30% by weight.

9. An optoelectronic device according to claim 1, wherein concentration of the inorganic nanoparticles in the electron transporting layer ranges from about 15% by weight to about 25% by weight.

10. An optoelectronic device according to claim 1, wherein particle size of the inorganic nanoparticles ranges from about 10 nm to about 100 nm.

11. An optoelectronic device according to claim 1, wherein the electron transporting layer comprises pyridinyl functionality.

12. An optoelectronic device according to claim 1, wherein a refractive index of the inorganic nanoparticles is less than a refractive index of the organic matrix.

13. An optoelectronic device according to claim 1, wherein the inorganic nanoparticles have a refractive index less than or equal to about 1.7.

14. An optoelectronic device according to claim 1, wherein the inorganic nanoparticles have a refractive index less than or equal to about 1.5.

15. An optoelectronic device according to claim 1, wherein the inorganic nanoparticles have a refractive index less than or equal to about 1.4.

16. An optoelectronic device according to claim 1, wherein the inorganic nanoparticles comprise any one or more of $BeF_2$, $MgF_2$, $CaF_2$, $SrF_2$, $BaF_2$ or combinations thereof.

17. An optoelectronic device according to claim 16 wherein the organic matrix comprises any one or more of poly(9,9-mono- or disubstituted fluorene), tris(8-hydroxyquinolato) aluminum (Alq3), 2,9 dimethyl-4,7-diphenyl-1,1-phenanthroline, 4,7-diphenyl-1, 1 O-phenanthroline, 2-(4-biphenylyl)-5-(4-t butylphenyl)-1,3,4-oxadiazole, 3-(4-biphenylyl)-4-phenyl-5 (4-t butylphenyl)-1,2,4triazole, 1,3,4-oxadiazole-containing polymers, 1,3,4-triazole-containing polymers, quinoxaline-containing polymers and cyano-PPV.

* * * * *